United States Patent
Man et al.

(10) Patent No.: US 9,202,671 B2
(45) Date of Patent: Dec. 1, 2015

(54) CHARGED PARTICLE BEAM APPARATUS AND SAMPLE PROCESSING METHOD USING CHARGED PARTICLE BEAM APPARATUS

(71) Applicant: HITACHI HIGH-TECH SCIENCE CORPORATION, Tokyo (JP)

(72) Inventors: Xin Man, Tokyo (JP); Atsushi Uemoto, Tokyo (JP); Tatsuya Asahata, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 71 days.

(21) Appl. No.: 14/220,981

(22) Filed: Mar. 20, 2014

(65) Prior Publication Data

US 2014/0291511 A1    Oct. 2, 2014

(30) Foreign Application Priority Data

Mar. 27, 2013   (JP) .................................. 2013-067319

(51) Int. Cl.
*H01J 37/252*   (2006.01)
*H01J 37/26*    (2006.01)
*H01J 37/30*    (2006.01)

(52) U.S. Cl.
CPC ........... *H01J 37/3002* (2013.01); *H01J 37/252* (2013.01); *H01J 37/26* (2013.01)

(58) Field of Classification Search
CPC ..... H01J 37/3002; H01J 37/252; H01J 37/26; H01J 2237/20292; H01J 2237/25; H01J 2237/2804; H01J 2237/2805; G01N 23/203

USPC .......................................... 250/306, 307, 310
See application file for complete search history.

(56) References Cited

U.S. PATENT DOCUMENTS

| | | | | |
|---|---|---|---|---|
| 7,972,440 B2 * | 7/2011 | Houge et al. | ................... | 117/201 |
| 8,664,598 B2 * | 3/2014 | Hasuda et al. | ................ | 250/310 |
| 8,803,111 B2 * | 8/2014 | Man | ......................... | 250/492.22 |
| 9,046,472 B2 * | 6/2015 | Man et al. | ............................. | 1/1 |
| 2004/0188610 A1 * | 9/2004 | Hirose | .......................... | 250/310 |
| 2015/0060664 A1 * | 3/2015 | Man et al. | ..................... | 250/307 |
| 2015/0060695 A1 * | 3/2015 | Man et al. | ................ | 250/442.11 |

FOREIGN PATENT DOCUMENTS

JP          2011159483          8/2011

* cited by examiner

*Primary Examiner* — Jack Berman
(74) *Attorney, Agent, or Firm* — Adams & Wilks

(57) ABSTRACT

A charged particle beam apparatus includes a sample stage, a focused ion beam column, a scattered electron detector that detects backscattered electrons generated from a cross-section of a sample, a crystal orientation information generation unit that generates crystal orientation information on a predetermined region of the cross-section, and an angle calculation unit that calculates attachment angles of the sample stage, corresponding to a direction of the cross-section. In response to receiving input of information indicating that the crystal orientation information on the region displayed on a display unit is changed to aimed second crystal orientation information, the angle calculation unit calculates the attachment angles corresponding to the direction of the cross-section for generating the second crystal orientation information, and the focused ion beam column performs etching processing on the cross-section at the calculated attachment angles.

6 Claims, 5 Drawing Sheets

CHARGED PARTICLE BEAM APPARATUS AND SAMPLE PROCESSING METHOD USING CHARGED PARTICLE BEAM APPARATUS

This application claims priority from Japanese Patent Application No. 2013-067319 filed on Mar. 27, 2013, the entire subject-matter of which is incorporated herein by reference.

BACKGROUND

1. Technical Field

The disclosure relates to a charged particle beam apparatus which irradiates a sample with electron beams so as to detect emitted backscattered electrons and acquires a diffraction image (EBSD image), a sample processing method using the charged particle beam apparatus, and a sample processing computer program using the charged particle beam apparatus.

2. Description of the Related Art

One of scanning electron microscopes, which focuses electron beams, scans a sample surface with the electron beams so as to detect generated secondary electrons and obtain a secondary electron image, and measures an electron back-scatter diffraction (EBSD) image by using a detector detecting backscattered electrons, is available in the market. By the use of the microscope, it is possible to obtain crystal orientation information of the sample.

In addition, an apparatus is being currently developed in which a focused ion beam column which irradiates a sample with focused ion beams so as to form a cross-section is mounted in the scanning electron microscope (refer to JP-A-2011-159483). Therefore, the cross-section processed by the focused ion beams (FIBs) can be irradiated with electron beams so as to detect backscattered electrons, and thus cross-section processing of the sample and EBSD measurement can be performed on the spot in a single apparatus. Accordingly, EBSD can be efficiently measured.

SUMMARY

In a case of a crystalline sample such as a metal material, it is necessary to manufacture a cross-section sample of crystal grains with a specific crystal orientation exposed in order to analyze mechanical characteristics in the specific crystal orientation. However, in order to process such a cross-section, EBSD measurement is performed on the cross-section of the sample, and FIB processing is required to be repeatedly performed while adjusting an incidence angle (in practice, an angle of a sample stage to which the sample is attached) of focused ion beams until the crystal orientation is obtained. For this reason, there is a problem in that it is difficult to accurately obtain a cross-section representing the crystal orientation and a work load is considerable.

In addition, if cross-section processing is performed on a crystalline sample, there is a case where a curtain effect occurs in which unevenness appears on a cross-section. In this case, since the curtain effect can be minimized if cross-section processing is performed by using FIBs so as to expose a specific crystal orientation, it is necessary to easily manufacture a cross-section in which the crystal orientation is exposed.

Therefore, illustrative aspects of the present invention provide a charged particle beam apparatus which can easily and accurately form a cross-section representing a specific crystal orientation, a sample processing method using the charged particle beam apparatus, and a sample processing computer program using the charged particle beam apparatus.

According to one illustrative aspect of the present invention, there may be provided a charged particle beam apparatus comprising: an electron beam column configured to perform irradiation with electron beams; a sample stage configured to support a sample; a focused ion beam column configured to irradiate the sample with focused ion beams so as to form a cross-section; a scattered electron detector configured to detect backscattered electrons which are generated from the cross-section by the irradiation with the electron beams; a crystal orientation information generation unit configured to generate crystal orientation information on a predetermined region of the cross-section on the basis of the backscattered electrons; an angle calculation unit configured to calculate attachment angles of the sample stage, corresponding to a direction of the cross-section; and a display unit configured to display the crystal orientation information, wherein in response to receiving input of information indicating that the crystal orientation information on the region displayed on the display unit is changed to aimed second crystal orientation information, the angle calculation unit is configured to calculate the attachment angles corresponding to the direction of the cross-section for generating the second crystal orientation information, and the focused ion beam column is configured to irradiate the sample with focused ion beams at the calculated attachment angles so that the cross-section is subject to etching processing.

According to the charged particle beam apparatus, it is possible to easily and accurately form a cross-section representing a specific crystal orientation.

According to another illustrative aspect of the present invention, the focused ion beams may intersect the electron beams substantially perpendicularly.

According to still another illustrative aspect of the present invention, the focused ion beams may intersect the electron beams at an intersection angle $\phi$ (where $0<\phi<90$ degrees), and the angle calculation unit may be configured to calculate the attachment angles further on the basis of the intersection angle $\phi$.

According to still another illustrative aspect of the present invention, the sample stage may have a rotation axis which is substantially parallel to the focused ion beams.

According to still another illustrative aspect of the present invention, there may be provided a sample processing method using a charged particle beam apparatus, the method comprising: detecting backscattered electrons which are generated from a cross-section of a sample by irradiation with electron beams; generating crystal orientation information on a predetermined region of the cross-section on the basis of the backscattered electrons; calculating attachment angles of a sample stage supporting the sample, corresponding to a direction of the cross-section; and displaying the crystal orientation information, wherein in response to receiving input of information indicating that the crystal orientation information on the region is changed to aimed second crystal orientation information, the calculating comprises calculating the attachment angles corresponding to the direction of the cross-section for generating the second crystal orientation information, and the method further comprises irradiating the sample with focused ion beams at the calculated attachment angles so that the cross-section is subject to etching processing.

According to still another illustrative aspect of the present invention, there may be provided a non-transitory computer-readable medium having a computer program for sample processing using a charged particle beam apparatus stored thereon and readable by a computer, the computer program, when executed by the computer, causes the computer to perform operations comprising: detecting backscattered electrons which are generated from a cross-section of a sample by irradiation with electron beams; generating crystal orientation information on a predetermined region of the cross-section on the basis of the backscattered electrons; calculating attachment angles of a sample stage supporting the sample, corresponding to a direction of the cross-section; and displaying the crystal orientation information, wherein in response to receiving input of information indicating that the crystal orientation information on the region is changed to aimed second crystal orientation information, the calculating comprises calculating the attachment angles corresponding to the direction of the cross-section for generating the second crystal orientation information, and the operations further comprise irradiating the sample with focused ion beams at the calculated attachment angles so that the cross-section is subject to etching processing.

According to the illustrative aspects of the present invention, it is possible to easily and accurately form a cross-section representing a specific crystal orientation by using the charged particle beam apparatus.

DETAILED DESCRIPTION

Hereinafter, an illustrative embodiment of the present invention will be described with reference to the drawings.

Figure 1:
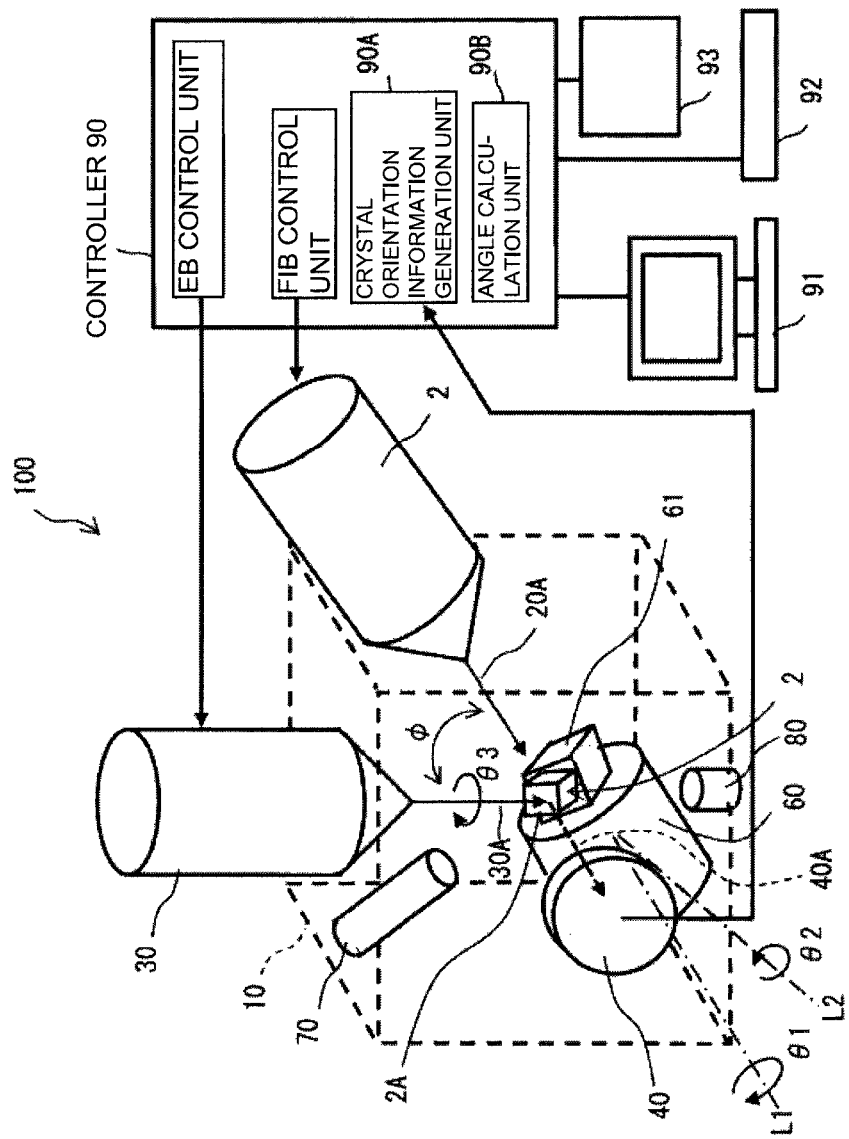
FIG. 1 is a block diagram illustrating an entire configuration of a charged particle beam apparatus according to an illustrative embodiment of the present invention.

FIG. 1 is a block diagram illustrating an entire configuration of a charged particle beam apparatus 100 according to an illustrative embodiment of the present invention. In FIG. 1, the charged particle beam apparatus 100 includes a vacuum chamber 10; an ion beam irradiation system (one example of a focused ion beam column) 20 configured to perform irradiation with focused ion beams 20A; an electron beam irradiation system (one example of an electron beam column) 30 configured to perform irradiation with electron beams 30A; a scattered electron detector 40; a sample stage 60 configured to support a sample 2; a secondary charged particle detector 70; a transmitted electron detector 80; and a controller 90. The inside of the vacuum chamber 10 is decompressed to a predetermined vacuum degree, and some or all of the constituent elements of the charged particle beam apparatus 100 are disposed in the vacuum chamber 10. In addition, the sample 2 is attached to a holder 61, and the holder 61 is installed on the sample stage 60.

The ion beam irradiation system 20 and the electron beam irradiation system 30 are disposed so that the focused ion beams 20A intersect the electron beams 30A at an intersection angle $\phi$ (where 0<$\phi$<90 degrees). In addition, the scattered electron detector 40 is disposed so as to be perpendicular to the ion beam irradiation system 20 and the electron beam irradiation system 30.

The sample stage 60 is provided with movement mechanisms, and the movement mechanisms can displace the sample stage 60 in five axes. The movement mechanisms include an XYZ movement mechanism which moves the sample stage 60 in parallel to a horizontal plane and along an X axis and a Y axis perpendicular to each other, and a Z axis perpendicular to the X axis and the Y axis; a rotation mechanism which rotates the sample stage 60 around the Z axis; and a tilt mechanism which rotates the sample stage 60 around the X axis (or the Y axis). The sample stage 60 is displaced in the five axes, and thus the sample 2 is moved to irradiation positions of the ion beams 20A and the electron beams 30A.

An angle at which the sample stage 60 is oriented by the movement mechanisms is one example of an attachment angle. A cross-section 2A is also oriented in a predetermined direction so as to correspond to the sample stage 60 having a predetermined attachment angle.

The sample stage 60 has a rotation axis L1 which is substantially parallel to the focused ion beams 20A, and a rotation angle around the rotation axis L1 is set to $\theta1$. In addition, the sample stage 60 has a rotation axis (tilt mechanism) L2 which is perpendicular to the rotation axis L1 and is also perpendicular to the ion beam irradiation system 20 and the electron beam irradiation system 30, and a rotation angle around the rotation axis L2 is set to $\theta2$. Further, the sample stage 60 is rotated around the electron beams 30A, and this rotation angle is set to $\theta3$. An attachment angle of the sample stage 60 is determined by the three rotation angles $\theta1$, $\theta2$ and $\theta3$.

The controller 90 may be formed by a computer which includes a CPU as a central processing unit, a storage unit (RAM and ROM) 93 which stores data or programs, and an input port and an output port which perform inputting and outputting of signals with an external apparatus. The controller 90 controls the respective constituent elements of the charged particle beam apparatus 100 by the CPU performing various operation processes on the basis of the program stored in the storage unit 93. In addition, the controller 90 is electrically connected to control lines of the ion beam (hereinafter, a focused ion beam will be abbreviated to an "ion beam" as appropriate) irradiation system 20, the electron beam irradiation system 30, the scattered electron detector 40, the secondary charged particle detector 70, the transmitted electron detector 80, and the sample stage 60.

The controller 90 includes a crystal orientation information generation unit 90A, and an angle calculation unit 90B.

In addition, the controller 90 drives the sample stage 60 on the basis of a command of software or an input by an operator so as to adjust a position or a posture of the sample 2, thereby adjusting an irradiation position or an irradiation angle of the ion beams 20A on a surface of the sample 2.

Further, the controller 90 is connected to input means 92 such as a keyboard for acquiring an input command from an operator, and a display unit 91.

The ion beam irradiation system 20 includes an ion source which generates ions, and an ion optical system which forms ions emitted from the ion source as focused ion beams and scans the ion beams. If the sample 2 is irradiated with the ion beams 20A which are charged particle beams, secondary charged particles such as secondary ions or secondary electrons are generated from the sample 2. Since an image of the sample 2 is acquired when the secondary charged particles are detected by the secondary charged particle detector 70, an irradiation position of the ion beams 20A can be confirmed.

The ion beam irradiation system 20 increases an irradiation amount of the ion beams 20A so as to process (removal process) the cross-section 2A of the sample 2 in an irradiation range. The cross-section 2A of the sample 2 is exposed through etching processing using the ion beams 20A, so as to form an observation surface for acquiring an EBSD image.

The ion optical system includes, for example, a condenser lens configured to focus the ion beams 20A; a diaphragm for narrowing the ion beams 20A; an aligner configured to adjust an optical axis of the ion beams 20A; an objective lens for focusing the ion beams 20A on a sample; and a deflector configured to scan the ion beams 20A on the sample.

In addition, the controller 90 (FIB control unit) transmits an irradiation signal to the ion beam irradiation system 20 so as to apply the ion beams 20A.

The electron beam irradiation system 30 includes an electron source which emits electrons, and an electron optical system which focuses and scans electrons emitted from the electron source. The sample 2 is irradiated with the electron beams 30A emitted from the electron beam irradiation system 30, reflected electrons generated from the sample 2 are detected by a reflected electron detector (not illustrated), and thus a reflected electron image of the sample 2 can be acquired. Therefore, an irradiation position of the electron beams 30A can be confirmed. In addition, as will be described later, backscattered electrons 40A generated by irradiating the sample 2 with the electron beams 30A are detected by the scattered electron detector 40, thereby allowing an electron back-scatter diffraction (EBSD) image to be measured.

Further, the controller 90 (EB control unit) transmits an irradiation signal to the electron beam irradiation system 30 so as to apply the electron beams 30A.

The scattered electron detector 40 detects the backscattered electrons 40A as described above. When the electron beams 30A are incident on the sample 2 (the cross-section 2A thereof) with a crystal structure, inelastic scattering occurs backward, and thus a linear pattern (Kikuchi image) unique to a crystal orientation due to Bragg diffraction at the cross-section 2A (crystal surface) is observed. A crystal orientation of the cross-section 2A of the sample can be obtained by analyzing the Kikuchi image. In addition, a direction of the backscattered electrons 40A is represented by a polar coordinate $(\sigma,\xi)$ which has a direction of a perpendicular line from an irradiation point of the electron beams 30A on the cross-section 2A to the scattered electron detector 40 (a fluorescent screen thereof) as a pole, and a plane coordinate on a fluorescent plate when the direction reaches the fluorescent plate is represented by $(S \times \tan\sigma, \xi)$ with a position of the perpendicular line as an origin. Here, S indicates a distance between the irradiation point and the fluorescent plate. An orientation can be analyzed from the position on the plane coordinate of the Kikuchi image.

Figure 2:
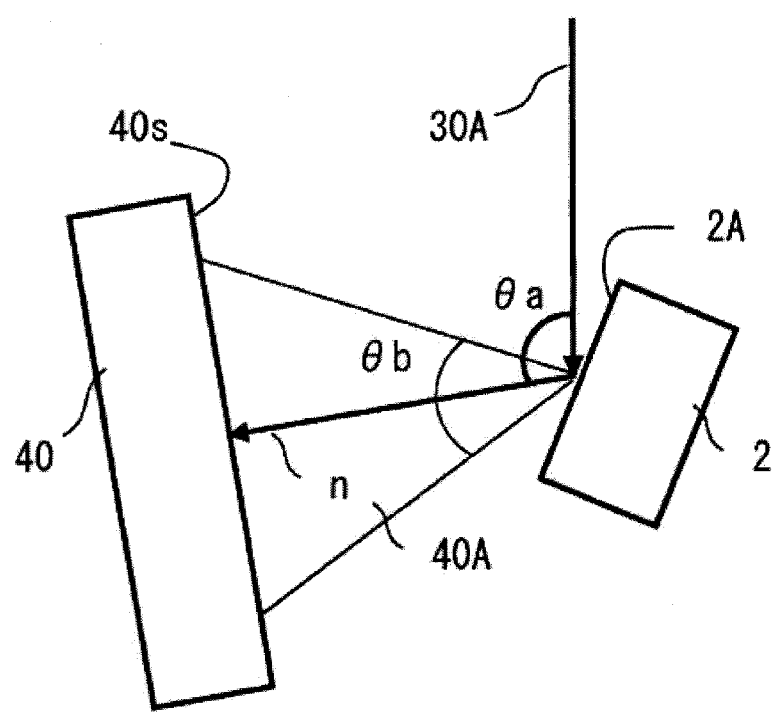
FIG. 2 is a diagram illustrating a region of backscattered electrons reaching a scattered electron detector when viewed from a direction perpendicular to electron beams.

In addition, the EBSD measurement mainly uses a diffraction pattern of backscattered electrons which are spread with a width of about 70 degrees centering on about 100 degrees with respect to incident electron beams and are emitted from a sample surface. FIG. 2 illustrates a region of the backscattered electrons 40A reaching the scattered electron detector 40 when viewed from a direction perpendicular to the electron beams 30A. The backscattered electrons 40A are emitted with the spread of a width θb (about 70 degrees) centering on a line n of an angle θa (about 100 degrees) with respect to a direction in which the sample 2 is irradiated with the electron beams 30A, and reach a detection surface 40s of the scattered electron detector 40. The spread backscattered electrons 40A need only to reach the detection surface 40s as described above, and the line n is not required to be parallel to a normal line of the detection surface 40s. This is because an angle of the backscattered electrons 40A incident on the detection surface 40s of the scattered electron detector 40 is optimized in accordance with characteristics of the detector 40.

The scattered electron detector 40 includes a fluorescent screen (not illustrated) as the detection surface. A signal of an image projected onto the fluorescent screen is transmitted to the crystal orientation information generation unit 90A, and the crystal orientation information generation unit 90A analyzes the signal so as to form an EBSD image indicating a crystal orientation of the sample.

The crystal orientation information generation unit 90A is operated by executing an image analysis program, and has a crystal orientation database for determining a crystal orientation on the basis of a signal from the scattered electron detector 40. The crystal orientation database is information including a material name of a sample, a crystal structure thereof, a crystal orientation thereof, patterns of backscattered electrons corresponding thereto, and the like. In addition, the crystal orientation database also includes the polar coordinate $(\sigma,\xi)$, S, calculation expressions or conversion expressions (Hough conversion or the like) for forming a Kikuchi image from a Bragg angle in a specific orientation, and the like. The crystal orientation information generation unit 90A is mounted as orientation imaging microscopy (OIM).

The display unit 91 displays the EBSD image formed by the crystal orientation information generation unit 90A.

Figure 3A:
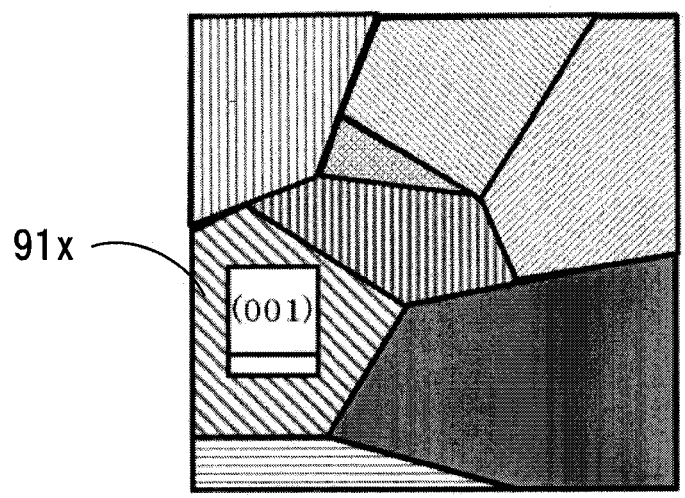
FIGS. 3A and 3B are diagrams illustrating an example of an EBSD image (region) displayed on a display unit before and after a direction of a cross-section is changed.

FIG. 3A illustrates an example of an EBSD image 91a displayed on the display unit 91. The EBSD image 91a displays orientations with different color tones. A region 91x having a color tone different from the surroundings corresponds to a specific orientation in the EBSD image 91a. In FIG. 3A, a cube indicating the region 91x deviates from a square indicating the (001) face, and the region 91x slightly deviates from the (001) face. In addition, the region 91x typically corresponds to a single crystal grain, but includes a plurality of crystal grains in a case where adjacent crystal grains have the same orientation.

A crystal orientation in each region 91x of the EBSD image 91a is one example of crystal orientation information.

Now, a case is considered in which a face of the region 91x is desired to be parallel to the (001) face. For example, the case corresponds to a case where a cross-section sample in which a crystal grain having the (001) face is exposed is created and analyzed, or cross-section processing is performed using FIBs so as to expose the (001) face, thereby minimizing the curtain effect. In this case, a direction of the entire cross-section 2A including the region 91x may be changed so that the region 91x is parallel to the (001) face.

Figure 3B:
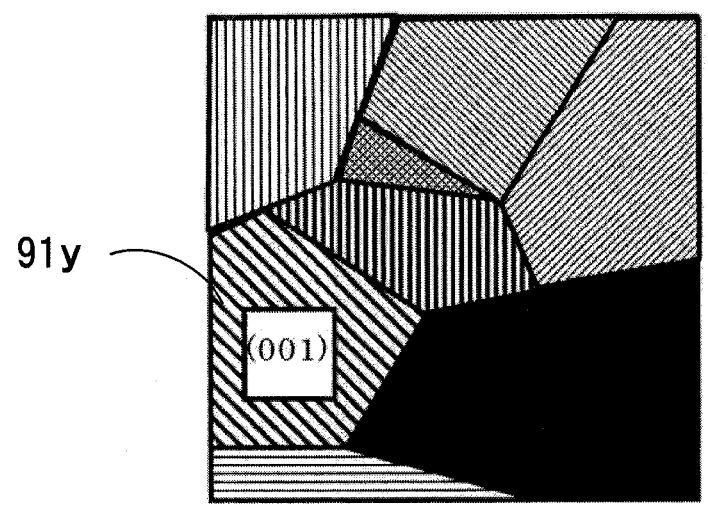

Therefore, first, an operator designates (selects) the region 91x in the EBSD image 91a, and changes the region 91x to a desired orientation (the (001) face). FIG. 3B illustrates an EBSD image 91b after a direction of the entire cross-section 2A including the region 91x is changed. The region 91x is changed to a region 91y parallel to the (001) face.

This changing may be performed, for example, by the operator appropriately inputting a rotation direction or an angle of the region 91x on the EBSD image 91a and performing adjustment so that the region 91y after being rotated has a color tone indicating the (001) face. In relation to the inputting, a numerical value may be input, and an angle may be input with a movement amount by selecting (clicking on) the region 91x on the EBSD image 91a and moving a cursor in a predetermined direction.

The crystal orientation information generation unit 90A calculates a crystal orientation ((001) face) of the region 91x when the entire cross-section 2A including the region 91x is rotated, on the basis of the input value, from the above-described crystal orientation database, and displays the calculated result as the EBSD image 91b and the region 91y after being rotated (FIG. 3B).

In addition, the crystal orientation ((001) face) of the region 91y after being rotated is one example of second crystal orientation information.

Although, in the above example, the operator inputs a rotation direction or an angle of the region 91x, for example, the operator may input an aimed crystal orientation ((001) face) itself, and the crystal orientation information generation unit 90A may calculate the rotation direction or the angle. In addition, the EBSD image 91b or the region 91y after being rotated may not be necessarily displayed.

The angle calculation unit 90B acquires the rotation direction or the angle of the region 91x, and calculates an angle of the cross-section 2A which is oriented to the (001) face when the region 91x is rotated and further attachment angles of the sample stage 60 supporting the sample 2.

The controller 90 displays the calculated attachment angles (the rotation angles θ1, θ2 and θ3) on the display unit 91, and the operator adjusts practical rotation angles of the sample stage 60 to the rotation angles θ1, θ2 and θ3 while looking at the attachment angles. Accordingly, a direction of the cross-section 2A of the sample 2 is changed.

The above-described "rotation direction or angle of the region 91x" used by the crystal orientation information generation unit 90A is an Euler angle (relative angle). On the other hand, the "attachment angles of the sample stage 60" calculated by the angle calculation unit 90B are absolute angle coordinates (θ1, θ2, and θ3) of the rotation axes.

In addition, instead of displaying the rotation angles θ1, θ2 and θ3 which are absolute coordinates of the attachment angles of the sample stage 60 after being rotated (tilted) as the calculated attachment angles on the display unit 91, angles (tilt angles) as a difference corresponding to a rotation (tilt) amount from the sample stage 60 before being rotated (tilted) may be displayed.

Needless to say, the backscattered electrons 40A are emitted with the spread of the width Ob centering on the angle θa when the electron beams 30A are incident on the cross-section 2A whose direction is changed as above.

In addition, although, in the above example, the operator inputs the attachment angles calculated by the angle calculation unit 90B and adjusts practical attachment angles of the sample stage 60 so as to change a direction of the cross-section 2A, for example, the controller 90 may control the movement mechanisms of the sample stage 60 so as to adjust the rotation angles θ1, θ2 and θ3 on the basis of an attachment angle calculated by the angle calculation unit 90B, thereby automatically changing a direction of the cross-section 2A.

Next, the operator allows the cross-section 2A whose direction is changed at the attachment angles to be irradiated with the ion beams 20A so that the cross-section 2A is subject to etching processing. Accordingly, it is possible to easily and accurately form the sample 2 having a cross-section of which the region 91y is oriented to the (001) face.

Figure 4A:
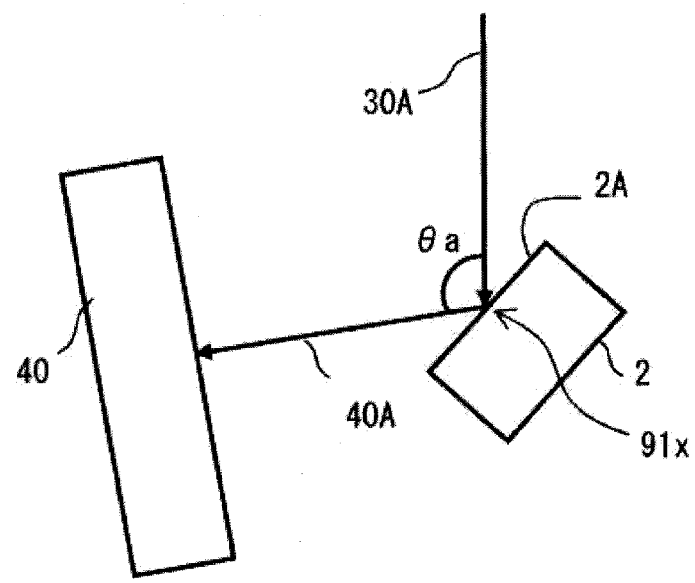
FIGS. 4A and 4B are diagrams illustrating a direction of a cross-section and backscattered electrons when viewed from a direction perpendicular to electron beams.

FIG. 4 illustrates a direction of the cross-section 2A and the backscattered electrons 40A when viewed from a direction perpendicular to the electron beams 30A. FIG. 4A illustrates the cross-section 2A whose direction is not changed. When the backscattered electrons 40A scattered from the region 91x are analyzed, the backscattered electrons have an orientation which slightly deviates from the (001) face (refer to FIG. 3A).

Figure 4B:
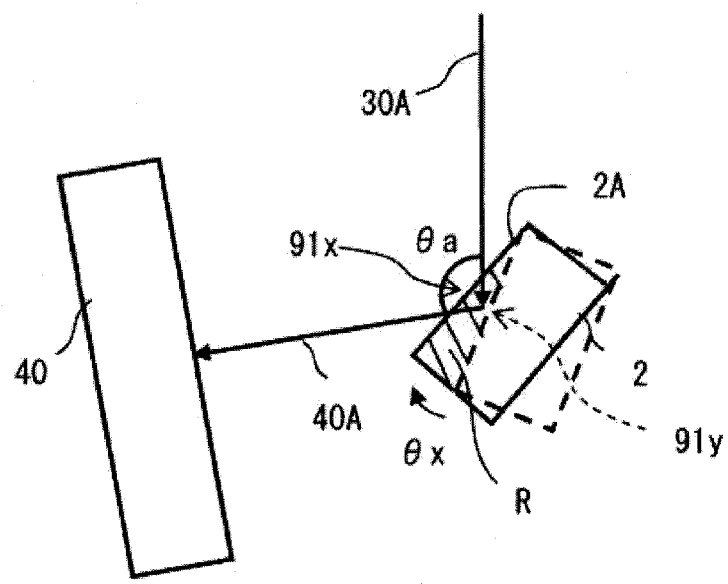

On the other hand, in FIG. 4B, the cross-section 2A whose direction is not changed is indicated by the solid line, and the cross-section 2A whose direction is changed clockwise by an angle Ox when viewed from a direction perpendicular to the electron beams 30A is indicated by the broken line. The backscattered electrons 40A scattered from the region 91y after the direction of the cross-section 2A is changed indicate the (001) face (refer to FIG. 3B). Therefore, a remaining part R is removed through etching processing using the ion beams 20A, from the cross-section 2A whose direction is not changed, so as to realize this direction of the cross-section 2A.

Here, FIG. 4 illustrates a direction of the cross-section 2A when viewed from the direction perpendicular to the electron beams 30A, but, in the present illustrative embodiment, the ion beam irradiation system 20 and the electron beam irradiation system 30 are disposed at an intersection angle φ which is not perpendicular.

Figure 5A:
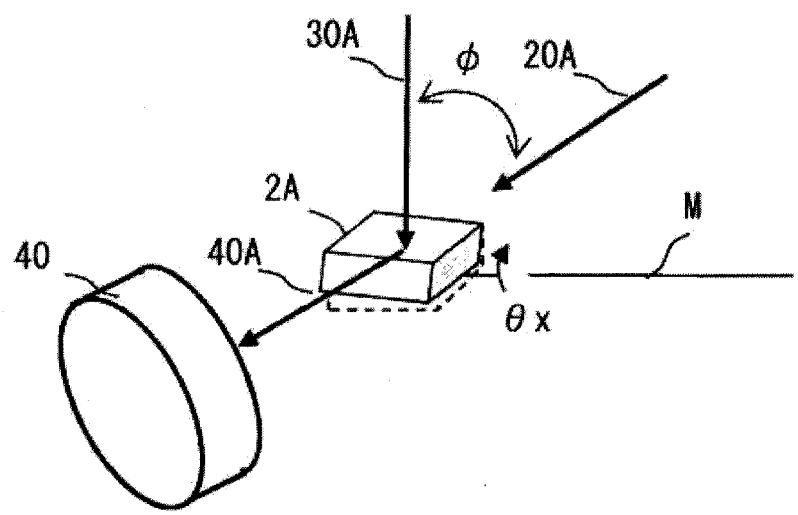
FIGS. 5A and 5B are perspective views illustrating a direction of the cross-section and backscattered electrons.

For this reason, as illustrated in FIG. 5A, a direction M perpendicular to the electron beam irradiation system 30 is not parallel to the ion beams 20A, and the part R cannot be removed even if the ion beams 20A are applied to the cross-section 2A whose direction is changed clockwise by the angle Ox when viewed from the direction M.

Figure 5B:
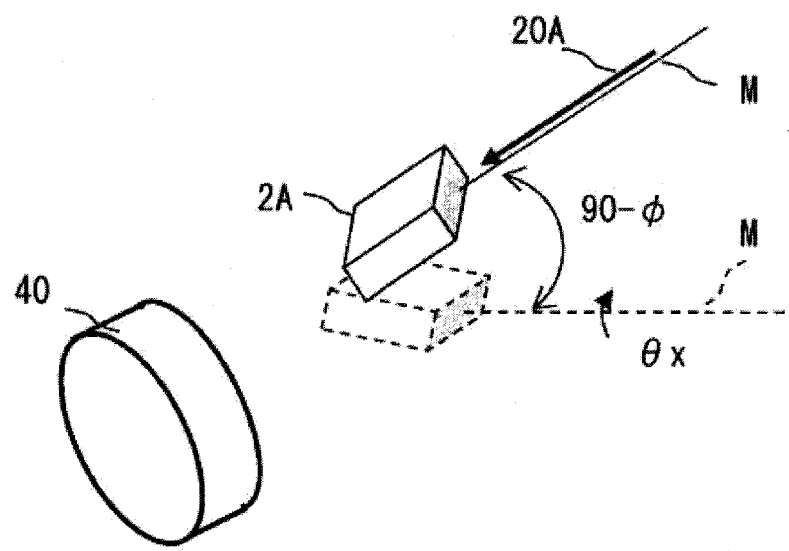

Therefore, as illustrated in FIG. 5B, the cross-section 2A whose direction is changed by the angle θx is further rotated by an angle (90-φ) around the axis L2 of FIG. 1 so that the cross-section 2A is parallel to the ion beams 20A, and then the etching processing is performed.

In addition, the direction M is parallel to the cross-section 2A, and is in the same plane as the focused ion beams 20A and the electron beams 30A.

In a case where the ion beam irradiation system 20 and the electron beam irradiation system 30 are disposed so as to be perpendicular to each other, the rotation in FIG. 5B is not necessary. This is because the cross-section processed by the ion beams 20A becomes an EBSD observation surface without change.

On the other hand, in a case where the ion beam irradiation system 20 and the electron beam irradiation system 30 are disposed at the intersection angle φ which is not perpendicular as illustrated in FIG. 1, it is necessary to perform the etching processing at the angle illustrated in FIG. 5B and then to return the sample 2 to the angle of FIG. 5A again for EBSD observation. This is because, as illustrated in FIG. 2, during the EBSD observation, the backscattered electrons 40A which are spread centering on the line n having the angle θa (about 100 degrees) with respect to the irradiation direction of the electron beams 30A are maintained at an angle for reaching the detection surface 40s of the scattered electron detector 40.

In addition, even in a case where the ion beam irradiation system 20 is disposed so as to be perpendicular to the electron beam irradiation system 30, the cross-section 2A is not parallel to the electron beams 30A depending on a direction of the rotated cross-section 2A. In this case, an angle of the sample 2 is changed and etching processing is performed as in FIG. 5B, and then the sample 2 is returned to the angle in FIG. 5A again for EBSD observation.

Further, in a case where the ion beam irradiation system 20 and the electron beam irradiation system 30 are disposed so as to be perpendicular to each other, a scanning direction of the ion beams 20A can be rotated by the rotation angle θ1 instead of rotating the sample stage 60 by θ1 on the basis of attachment angles calculated by the angle calculation unit 90B.

Since the cross-section 2A of the processed sample 2 is irradiated with, for example, the electron beams 30A, and transmitted electrons are analyzed by the transmitted electron detector 80, it is possible to analyze the cross-section sample in which the crystal grain having the (001) face is exposed without replacing the sample 2. Of course, an analysis device for the cross-section 2A of the processed sample 2 is not limited to the transmitted electron detector 80, and other analysis devices may be mounted in the charged particle beam apparatus 100.

In addition, the processed sample 2 may be detached from the charged particle beam apparatus 100 so as to be used for other analysis and the like.

A sample processed according to the present invention can be used for evaluation of mechanical characteristics. In this case, for example, marking (for example, depot) is performed on a surface of an aimed crystal grain, and a cross-section representing a specific crystal orientation is formed. Next, a region including the crystal grain is cut out through FIB processing, is picked up by a probe, is fixed to a mesh holder while maintaining a position thereof, and is provided for evaluation of an analysis device such as TEM.

In addition, a sample is processed according to the present invention, thereby reducing the curtain effect. Here, the curtain effect is a phenomenon in which unevenness appears on a cross-section when a crystalline sample undergoes cross-section processing. This unevenness occurs due to an etching rate, and occurs depending on a crystal orientation. In addition, in a case where FIB processing is performed on a crystalline sample so as to form a cross-section, and the curtain effect occurs in the cross-section having a targeted crystal grain, a cross-section is formed, in which a crystal orientation which prevents the curtain effect from occurring is exposed, in the crystal grain, thereby reducing the curtain effect.

The present invention is not limited to the above illustrative embodiment, and includes various modifications and equivalents which fall within the spirit and the scope of the present invention.

What is claimed is:

1. A charged particle beam apparatus comprising:
    an electron beam column configured to perform irradiation with electron beams;
    a sample stage configured to support a sample;
    a focused ion beam column configured to irradiate the sample with focused ion beams so as to form a cross-section;
    a scattered electron detector configured to detect backscattered electrons which are generated from the cross-section by the irradiation with the electron beams;
    a crystal orientation information generation unit configured to generate crystal orientation information on a predetermined region of the cross-section on the basis of the backscattered electrons;
    an angle calculation unit configured to calculate attachment angles of the sample stage, corresponding to a direction of the cross-section; and
    a display unit configured to display the crystal orientation information,
    wherein in response to receiving input of information indicating that the crystal orientation information on the region displayed on the display unit is changed to aimed second crystal orientation information,
        the angle calculation unit is configured to calculate the attachment angles corresponding to the direction of the cross-section for generating the second crystal orientation information, and
        the focused ion beam column is configured to irradiate the sample with focused ion beams at the calculated attachment angles so that the cross-section is subject to etching processing.

2. The charged particle beam apparatus according to claim 1, wherein the focused ion beams intersect the electron beams substantially perpendicularly.

3. The charged particle beam apparatus according to claim 1,
    wherein the focused ion beams intersect the electron beams at an intersection angle $\phi$, where $0<\phi<90$ degrees, and
    wherein the angle calculation unit is configured to calculate the attachment angles further on the basis of the intersection angle $\phi$.

4. The charged particle beam apparatus according to claim 1, wherein the sample stage has a rotation axis which is substantially parallel to the focused ion beams.

5. A sample processing method using a charged particle beam apparatus, the method comprising:
    detecting backscattered electrons which are generated from a cross-section of a sample by irradiation with electron beams;
    generating crystal orientation information on a predetermined region of the cross-section on the basis of the backscattered electrons;
    calculating attachment angles of a sample stage supporting the sample, corresponding to a direction of the cross-section; and
    displaying the crystal orientation information, wherein in response to receiving input of information indicating that the crystal orientation information on the region is changed to aimed second crystal orientation information,
        the calculating comprises calculating the attachment angles corresponding to the direction of the cross-section for generating the second crystal orientation information, and
        the method further comprises irradiating the sample with focused ion beams at the calculated attachment angles so that the cross-section is subject to etching processing.

6. A non-transitory computer-readable medium having a computer program for sample processing using a charged particle beam apparatus stored thereon and readable by a computer, the computer program, when executed by the computer, causes the computer to perform operations comprising:
    detecting backscattered electrons which are generated from a cross-section of a sample by irradiation with electron beams;
    generating crystal orientation information on a predetermined region of the cross-section on the basis of the backscattered electrons;
    calculating attachment angles of a sample stage supporting the sample, corresponding to a direction of the cross-section; and
    displaying the crystal orientation information,
    wherein in response to receiving input of information indicating that the crystal orientation information on the region is changed to aimed second crystal orientation information,
        the calculating comprises calculating the attachment angles corresponding to the direction of the cross-section for generating the second crystal orientation information, and
        the operations further comprise irradiating the sample with focused ion beams at the calculated attachment angles so that the cross-section is subject to etching processing.

* * * * *